(12) United States Patent
Khalil et al.

(10) Patent No.: US 10,422,033 B2
(45) Date of Patent: Sep. 24, 2019

(54) GREEN METHOD FOR COATING A SUBSTRATE WITH SILVER NANOPARTICLES

(71) Applicant: KING SAUD UNIVERSITY, Riyadh (SA)

(72) Inventors: Mutasim Ibrahim Khalil, Riyadh (SA); Ibrahim Mutasim Ibrahim Khalil, Riyadh (SA)

(73) Assignee: King Saud University, Riyadh (SA)

( * ) Notice: Subject to any disclaimer, the term of this patent is extended or adjusted under 35 U.S.C. 154(b) by 0 days.

(21) Appl. No.: 15/439,913

(22) Filed: Feb. 22, 2017

(65) Prior Publication Data

US 2018/0237370 A1    Aug. 23, 2018

(51) Int. Cl.
| | |
|---|---|
| C23C 18/16 | (2006.01) |
| C23C 16/06 | (2006.01) |
| C23C 18/44 | (2006.01) |
| C23C 18/18 | (2006.01) |

(52) U.S. Cl.
CPC .......... C23C 16/06 (2013.01); C23C 18/1658 (2013.01); C23C 18/1698 (2013.01); C23C 18/1893 (2013.01); C23C 18/44 (2013.01)

(58) Field of Classification Search
CPC ............................ C03C 17/10; C23C 18/1658
USPC .......................................... 427/162–169, 191
See application file for complete search history.

(56) References Cited

U.S. PATENT DOCUMENTS

| | | | |
|---|---|---|---|
| 3,978,271 A | 8/1976 | Greenberg | |
| 4,228,220 A * | 10/1980 | Garrison | C25D 7/00 126/908 |
| 6,398,854 B1 * | 6/2002 | Aonuma | C23C 18/28 106/1.18 |
| 8,460,451 B2 | 6/2013 | Xu et al. | |
| 2003/0113448 A1 * | 6/2003 | Tratzky | C03C 17/004 427/230 |
| 2014/0056830 A1 * | 2/2014 | Pather | A61K 31/12 424/59 |
| 2015/0024215 A1 * | 1/2015 | Utsumi | C23C 18/285 428/418 |

FOREIGN PATENT DOCUMENTS

WO    WO 2012/167804 A1    12/2012

OTHER PUBLICATIONS

Shameli et al; Effect of Curcuma longa tuber powder extract on size of silver nanoparticles prepared by green method; Res Chem Intermed (2014) 40; pp. 1313-1325. published online Jan. 23, 2013. (Year: 2013).*

(Continued)

*Primary Examiner* — Elizabeth A Burkhart
(74) *Attorney, Agent, or Firm* — Richard C. Litman

(57) ABSTRACT

The method for coating a substrate with silver nanoparticles includes reducing a silver nitrate solution with an ethanol extract of the traditional Indian medicinal plant (*Curcuma Longa* L.), a naturally abundant antioxidant, to form a final solution, and contacting the final solution with the substrate to provide the silver nanoparticle coating. Formation of the silver nanoparticle coating on the substrate can be determined when a mirror in the final solution is observed. The thickness of the coating layer can be less than 125 nm. The coated substrates can be highly conductive.

11 Claims, 6 Drawing Sheets
(2 of 6 Drawing Sheet(s) Filed in Color)

(56) References Cited

OTHER PUBLICATIONS

Satishkumar et al; Immobilization of silver nanoparticles synthesized using curcuma longa tuber powder and extract on cotton cloth for bacterial activity; Bioresource technology 101 (2010); pp. 7958-7965. (Year: 2010).*

* cited by examiner

GREEN METHOD FOR COATING A SUBSTRATE WITH SILVER NANOPARTICLES

BACKGROUND OF THE INVENTION

1. Field of the Invention

The present invention relates to bio-nanotechnology, and particularly, to a method of nano-silvering or coating of glass substrates.

2. Description of the Related Art

Nanotechnology coating is a fast growing field that focuses on depositing uniform nanolayers of metals or metal oxides and on dispersing nano-suspensions homogeneously onto a substrate such as glass, metal, wood, automotives, floor, etc. Some nanolayer deposition applications include solar glass, float glass, and eyeglass or lenses. Dispersion applications include, for example, spraying catalyst inks in fuel.

It has been shown that β-diketone curcumin and curcuminoids (1,7-diaryl-1,6-heptadiene-3,5 diones), which are a group of naturally occurring 1,3-diketones constituting the yellow colored physiologically active component of the traditional Indian medicinal plant (*Curcuma Longa* L.) have potent antioxidant properties and good ligating ability for metal ions. Previously, *Curcuma Longa* tuber powder was used in the synthesis of silver nanoparticles by stirring a mixture of $AgNO_3$ and *C. Longa* powder aqueous extract for 24 hours at 25° C. However, the pH factor upon which the chemistry of curcumin is dependent was not addressed.

Silver metal nanoparticles possess the highest electrical conductivity, thermal conductivity and reflectivity of all metals, and therefore, can be used in a variety of applications, such as, catalysis, electronics, photonics, photography and as antibacterial active agents. The reduction process can be either chemical reduction, e.g., using hydrazine, hydrogen reducing atmosphere, or sodium borohydride ($NaBH_4$), or thermal reduction. Silver metal nanoparticles can also be prepared by ionizing γ60Co radiation, ultra violet high radiation and beam radiolysis.

Silver coating of substrates, e.g., glass substrates, are well known in the art. The Tollen's reaction is one example, and involves aldehyde as a reducing agent. Rochell salt, sodium tartarate, or tartaric acid are also used for the industrial manufacture of mirrors. Further, silver coating methods are also disclosed in U.S. Pat. Nos. 5,186,984, and 3,978,271, which are incorporated herein by reference in their entirety.

However, many of the known methods of coating substrates involve the use of hazardous chemicals, consume heat energy, are time-consuming, are economically unfeasible and/or difficult to carry out at a small or large scale. Typically, prior methods use either a spraying technique or vacuum at lower temperatures or temperatures of at least 260° C., while keeping the substrate in contact with the coating solution for hours. Therefore, it would be desirable to provide a benign, simple, quick and economically feasible process for nano-silvering of glass substrates of different shapes and curvatures that overcomes the drawbacks of the prior art.

Thus, a method of nano-silvering glass substrates utilizing a green process thereby, solving the aforementioned problems, is desired.

SUMMARY OF THE INVENTION

A method for coating a substrate with silver nanoparticles can include reducing a silver nitrate solution with an ethanol extract of the traditional Indian medicinal plant (*Curcuma Longa* L.) to form a final solution, and contacting the final solution with the substrate to provide the silver nanoparticle coating on the substrate. Formation of the silver nanoparticle coating on the substrate can be determined when a mirror in the final solution is observed. The ratio of the volume of the silver nitrate solution to the curcumin solution can be about 1:10. The silver nitrate solution can be an ammoniacal silver nitrate solution, including silver nitrate ($AgNO_3$) having a concentration of about 0.1M in aqueous ammonia (25%). The curcumin solution can be a 0.01 ethanolic solution of curcumin.

These and other features of the present invention will become readily apparent upon further review of the following specification and drawings.

BRIEF DESCRIPTION OF THE DRAWINGS

The patent or application file contains at least one drawing executed in color. Copies of this patent or patent application publication with color drawings will be provided by the Office upon request and payment of the necessary fee.

Similar reference characters denote corresponding features consistently throughout the attached drawings.

DETAILED DESCRIPTION OF THE PREFERRED EMBODIMENTS

Figure 1:
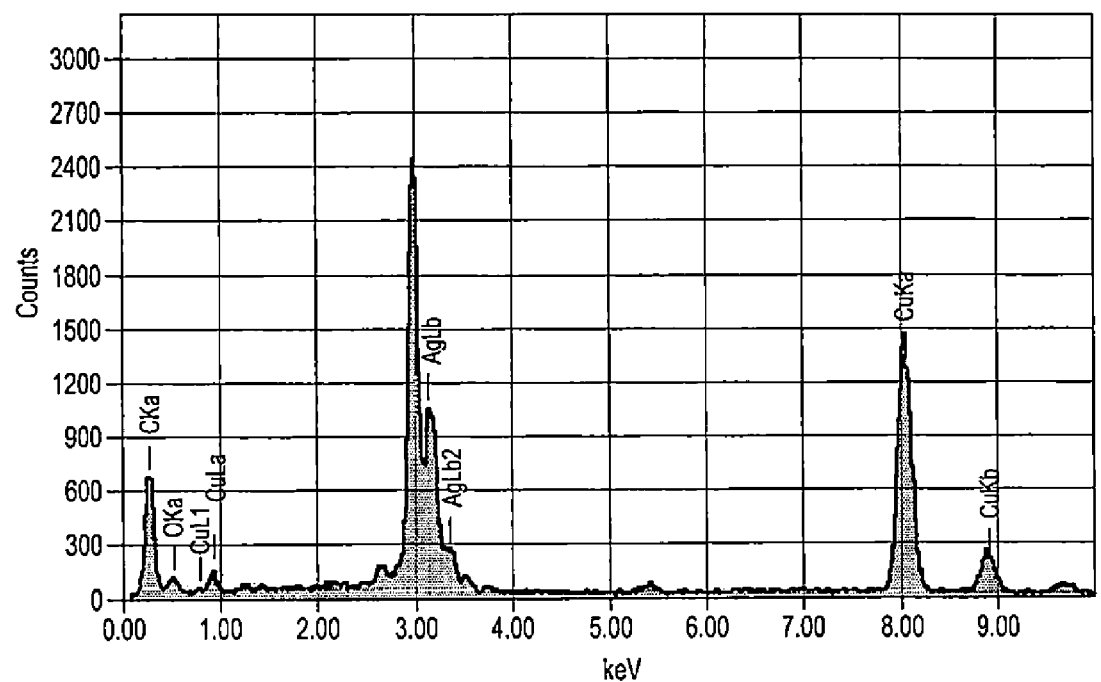
FIG. 1 shows the Energy-dispersive X-ray spectroscopy (EDS) spectrum of the as-prepared silver nanoparticles according to the method of the present invention.

A method for nano-silvering of a substrate or coating a substrate with silver nanoparticles can be used for nano-silvering substrates of different shapes and curvatures. The method can include reducing a silver nitrate solution with an ethanol extract of the traditional Indian medicinal plant (*Curcuma Longa* L.), a naturally abundant antioxidant, to form a final solution. Contacting of the final solution with the substrate can provide the silver nanoparticle coating. Formation of the silver nanoparticle coating on the substrate can be determined when a mirror in the final solution is observed. Formation of the mirror indicates reduction of the silver nitrate by the curcumin ($A_g^+$ to $Ag^0$) and the formation of the silver nanoparticles. The mirror back can be washed with warm distilled water and protected by paint.

The ratio of the volume of the silver nitrate solution to the curcumin solution can be about 1:10. The silver nitrate solution can be an ammoniacal silver nitrate solution, including silver nitrate (AgNO$_3$) having a concentration of about 0.1M in aqueous ammonia (25%). The curcumin solution can be a 0.01 ethanolic solution of curcumin.

Although the substrate is preferably glass, other substrates can be used as desired, such as metal or plastic substrates. Glass substrates can be in the form of flasks; bottles; beakers; thermos; tubes; rods; crystals; lenses and glass plates. The substrate can include a paraffin oil coating. The substrate can be pre-washed with an organic solvent (e.g., hexane and alcohol) followed by a stannous chloride (SnCl$_2$) solution, then rinsed with distilled water.

For substrates which are containers or can retain liquid, such as flasks, bottles, beakers, thermos, and tubes, the method for coating a substrate with silver nanoparticles preferably includes: i) contacting the substrate with a silver nitrate solution; (ii) adding an ammonia solution to the silver nitrate solution to form an ammoniacal silver nitrate solution having a pH of about 8.5 to about 9; and (iii) adding a curcumin solution to the ammoniacal silver nitrate solution to form a final solution. The curcumin solution can have a pH of about 8.5 to about 9. Once the curcumin solution is added to the ammoniacal silver nitrate solution to form the final solution, the final solution can either be mixed at room temperature for about 20-25 minutes (i.e., a mirror will appear within 20-25 minutes) or immersed in a water bath and maintained at a temperature of about 40° C. to about 90° C. for about 5 to about 10 minutes (i.e., a mirror will appear within 5-10 minutes).

For flat, glass substrates, two glass plates can be placed in a glass container, e.g., in a beaker facing each other. Silver nitrate can be added into the container followed by the addition of the curcumin solution. The glass container can then be immersed in a water bath at about 50° C., whereupon a mirror will appear within 10 minutes. Silvering one face of glass plates can be carried out either by blowing hot air from beneath the plate or heating the plates on a hot plate at a chosen temperature.

For glass rods, the glass rods can be immersed in the final solution including the silver nitrate solution and the curcumin solution to the level required for silvering, and kept immersed until the mirror appears.

The nano-silver coating layer on the surface of the substrate can have a thickness of less than about 125 nm. The silver nanoparticles can have an average particle size of about 1-10 nm, preferably 4-6 nm. For example, the silver nanoparticles can have an average size of about 5.9 nm±0.07 nm. The silver nanoparticles can be spherical, spheroidal, elongated spherical, triangular, cubic rod-shaped, and/or faceted. The nano-silver coated surface is electrically conductive and typically displays a bluish color. The color shade of the nano-silver coated surface is dependent upon the temperature of the reduction reaction and varies from silver to gray to blue to green as the temperature increases during the reduction reaction.

The coated substrate obtained by the method of the present invention can be used in various applications as a silver mirror without requiring any backing support necessary. The coated substrate can be useful, for example, in the mirror industry, as anti-reflective coating, for example for buildings, cars and glasses, as biofilms, as casings of electronic equipment, in electronic circuit boards, in solar cells, photography, photonics, catalysts, and in biology and medicine as antibacterial active agents. The method competes with or perhaps supersedes the thermal and hazardous chemical reduction processes for silver nanoparticles synthesis. The present method of nano-silvering glass is simple and could also be applied on an industrial scale.

The following examples will further illustrate the green processes of nano-silvering of glass substrates.

EXAMPLE 1

Extraction of Curcumin from *Curcuma Longa* L. Plant

The *Curcuma Longa* L. plant was purchased from a local market in Saudi Arabia. The plant was then powdered, dried and sieved. The curcumin powder (50 g) was soaked in ethanol (250 ml) with continuous stirring and refluxing for at least one day (24 hours). The mixture was then filtered and the red yellow filtrate was then concentrated. Curcumin concentration was determined by UV/Vis spectroscopy at λ max 420-423 nm. The ethanol was evaporated off using a rotary pump. The curcumin was then dried and stored until further use. One liter of 0.01 M curcumin stock solution was prepared by dissolving 3.68 g of the curcumin extract in 1.0 liter ethanol. The pH of the solution was raised to 8.5-9.0 by adding few drops of 25% ammonia solution. The deep red solution was then stored until further use.

EXAMPLE 2

Preparation of 0.1 M AgNO$_3$ Stock Solution

About 4.25 g AgNO$_3$ crystals were dissolved in 1 distilled water in a 250 ml volumetric flask. Then, 25% ammonia solution was added dropwise until a pH of 8.5-9.0 was attained. The total volume was increased to 250 ml by addition of distilled water. The solution was then kept in a dark bottle and stored for further use.

EXAMPLE 3

Preparation of Silver Metal Nanoparticles

About 0.17 g silver nitrate crystals were dissolved in 25 ml distilled water in a 50 ml centrifuge tube. 25% ammonia solution was then added dropwise until the brown precipitate just disappeared. About 10 ml of 0.01 M ethanolic solution of curcumin was then added and the whole solution mixture was heated in a microwave for 60 seconds whereupon a mirror was formed. The supernatant solution was then separated, centrifuged and the upper liquid layer was decanted. The silver particles were then sonicated in ethanol and characterized by the following spectroscopic methods.

FIG. 1 depicts the Energy-dispersive X-ray spectroscopy (EDX) spectrum of the silver particles. The bands at 3.0 keV (Lβ$_1$), 3.16 keV (Lβ$_1$), and 3.33 keV (Lβ$_2$) are assigned to silver. The bands assigned to copper and carbon from the support grid are seen at 8.0 (kα$_1$) and 9.0 (kβ$_1$) keV for copper and at 0.26 keV (kα$_1$) for carbon.

Figure 2:
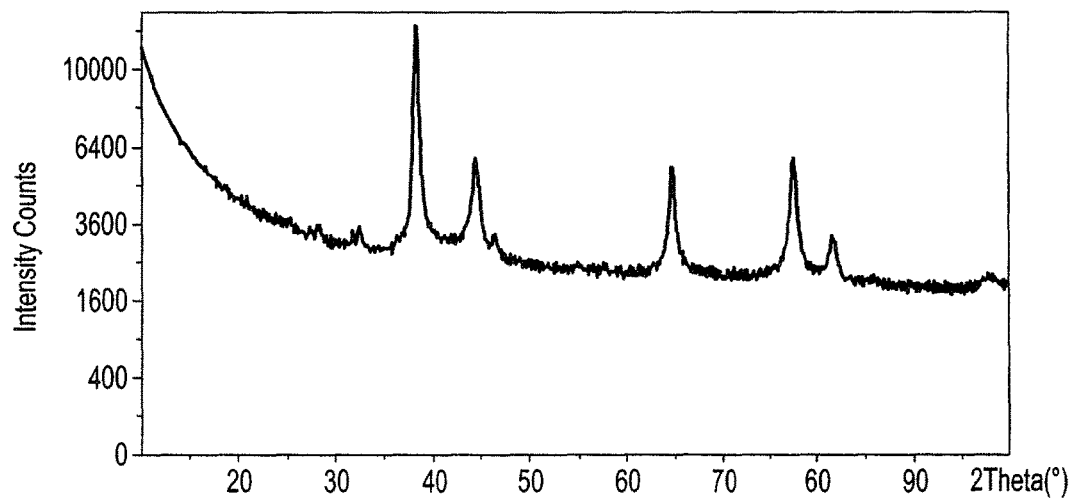
FIG. 2 shows a graph of the X-Ray Diffraction (XRD) patterns of silver nanoparticles prepared according to the method of the present invention.

FIG. 2 shows the X-Ray Diffraction (XRD) patterns of one sample of the synthesized silver nanoparticles and a peak list is presented in Table 1. The pattern is well in agreement with the literature values for silver nanoparticles exhibiting the characteristic peaks of metallic silver at 2θ=38.17, 44.46, 64.66, 77.57, and 81.75°. These prominent peaks represent the (111), (200), (220), (311) and (222) Bragg's reflections of fcc structure of silver, respectively. The nanoparticle size is indicated by the broadness of the reflected planes and the particle average size was calculated by Scherrer's equation from the (111), (220), and (311)

metallic silver deflections. The estimated crystallite size resulted in 7.3, 6.1, and 7.29 nm, respectively, with a mean value of 6.89 nm.

TABLE 1

| Pos. [°2θ] | Height [cts] | FWHM [°2θ] | d-spacing [Å] | Rel. Int.[%] |
|---|---|---|---|---|
| 38.1761 | 18858.38 | 0.2407 | 2.35745 | 100.00 |
| 44.4681 | 5931.72 | 0.0010 | 2.03741 | 31.45 |
| 64.6632 | 5501.79 | 0.5290 | 1.44149 | 29.17 |
| 77.5714 | 5821.90 | 0.8837 | 1.23072 | 30.87 |
| 81.7521 | 1463.71 | 0.0900 | 1.17804 | 7.76 |

Figure 3:
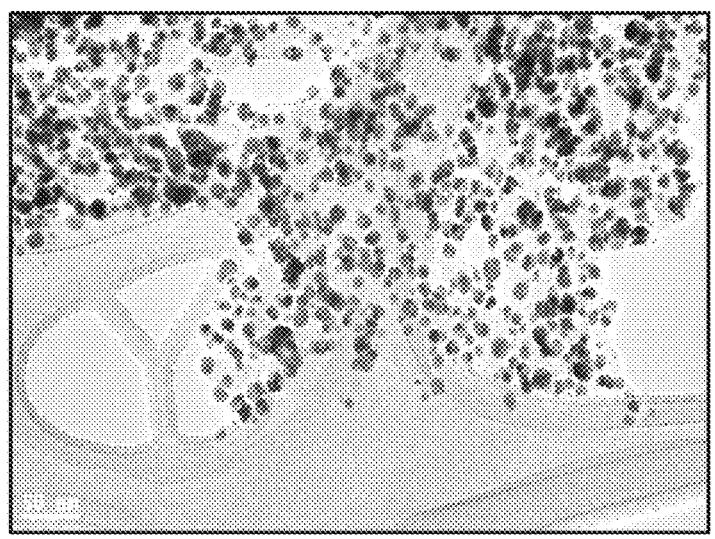
FIG. 3 shows the transmission electron micrograph (TEM) image of the silver nanoparticles prepared according to the method of the present invention.
Figure 4:
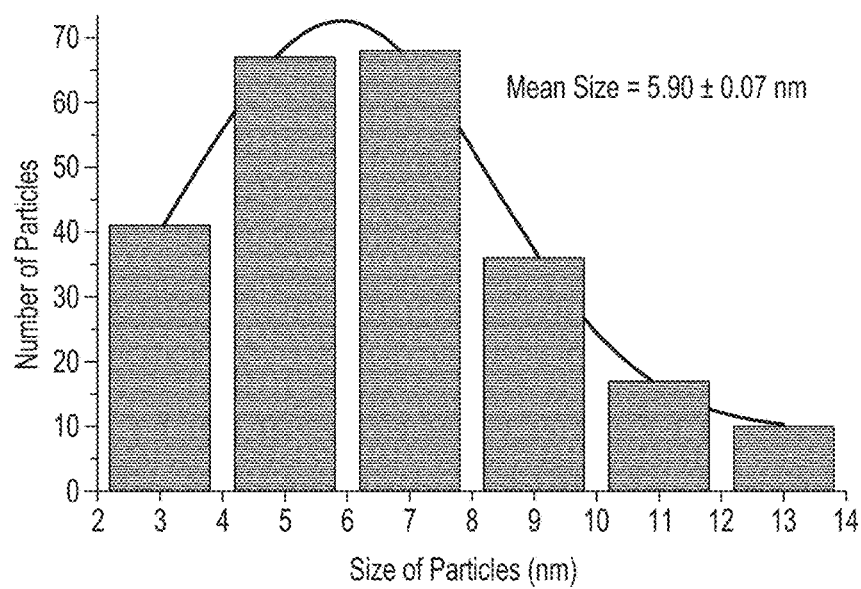
FIG. 4 shows a graph of the particles size distribution of the silver nanoparticles prepared according to the method of the present invention
Figure 5:
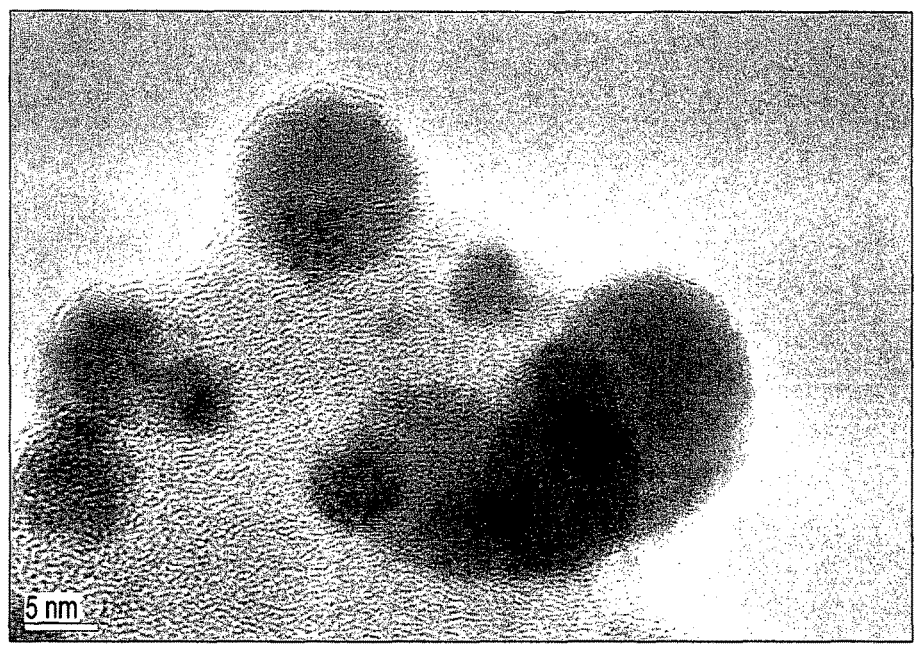
FIG. 5 shows the high resolution transmission electron micrograph (HRTEM) image of silver nanoparticles prepared according to the method of the present invention.

The morphology of the silver nanoparticles was investigated by Transmission Electron Micrograph (TEM) images, High Resolution TEM (HRTEM) and corresponding selected area electron diffraction pattern (SAEDP). FIG. 3 shows the TEM image of an ethanol solution of the as-prepared silver nanoparticles. The formation of randomly distributed and well separated metallic silver spherical nanoparticles is evident. As shown in FIG. 4, the crystallite size distribution is in the range of 2-14 nm, with an average particle size of 5.90±0.07 nm. In comparison, the chemical reduction of $AgNO_3$ resulted in Ag nanoparticles with an average size of 20 nm, 4-10 nm and 10 nm, while the thermal reduction produced 5±2 nm Ag nanoparticles. An average size of 100 nm was obtained by pulse radiolysis. This mean size observed from TEM image reconciles with that estimated from XRD pattern. Both TEM (FIG. 3) and HRTEM images (FIG. 5) indicate that very few number of nanoparticles agglomerate, owing to the high surface energy. It is surmised that the reducing reagent is also acting as a chelating agent to $Ag^+$ ions, a process that resulted in suppressing agglomeration.

EXAMPLE 3

Nano-Silvering of Glass Substrates (e.g., Flasks; Bottles; Beakers; Thermos and Tubes)

Figure 6:
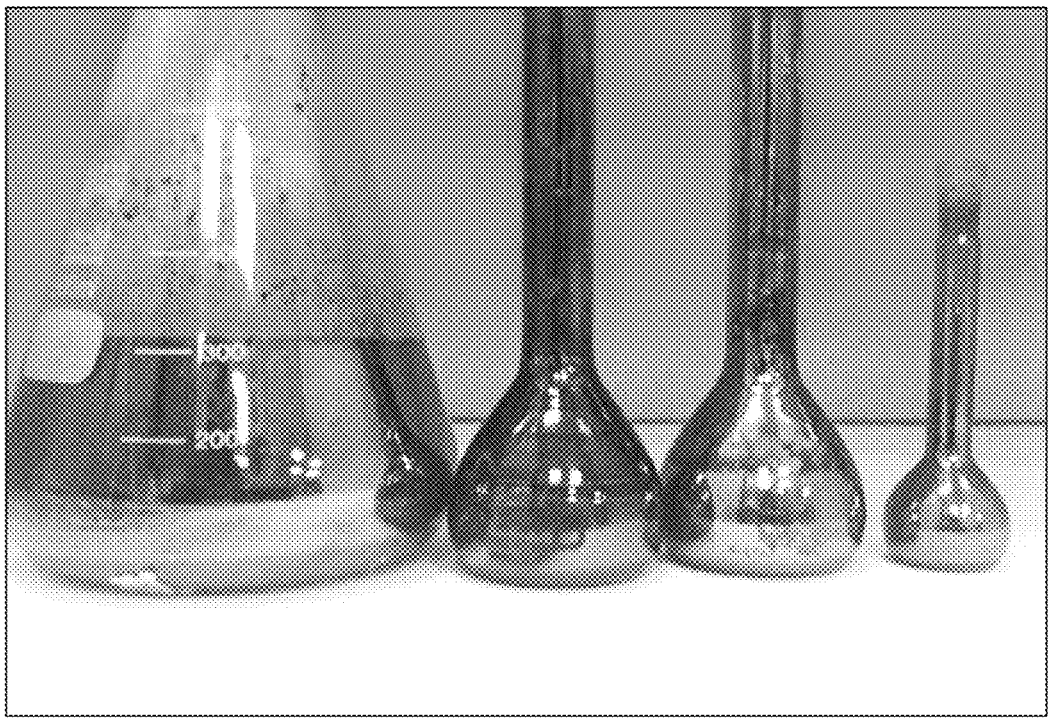
FIG. 6 shows the nano-silver coating of conical and volumetric flasks with mirror-effect and different shades of colors.
Figure 7:
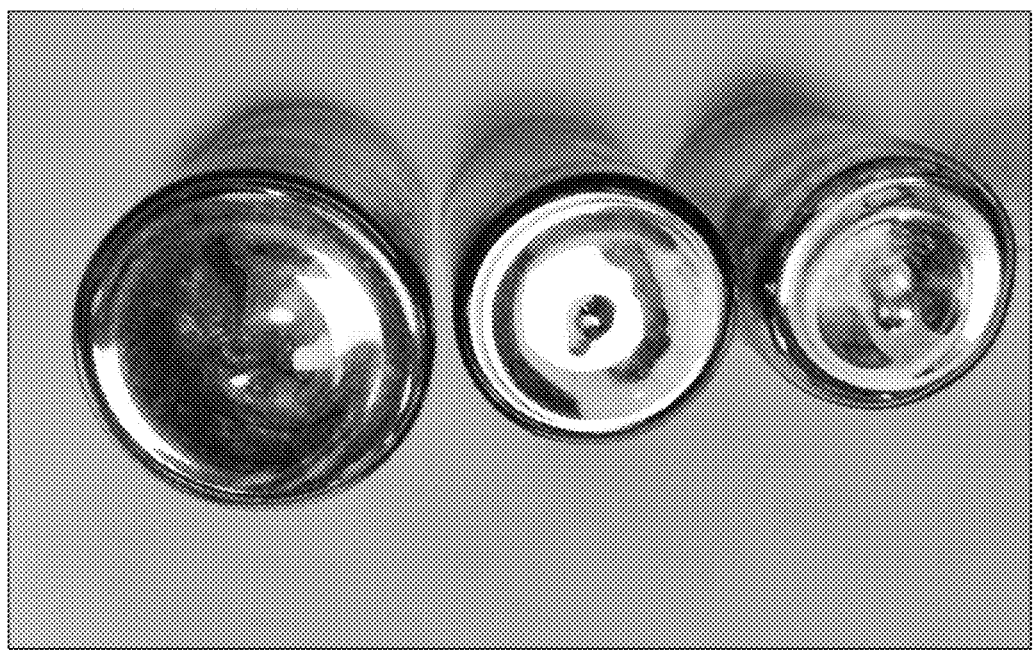
FIG. 7 shows the beaker bottoms coated with the silver nanoparticles.
Figure 8:
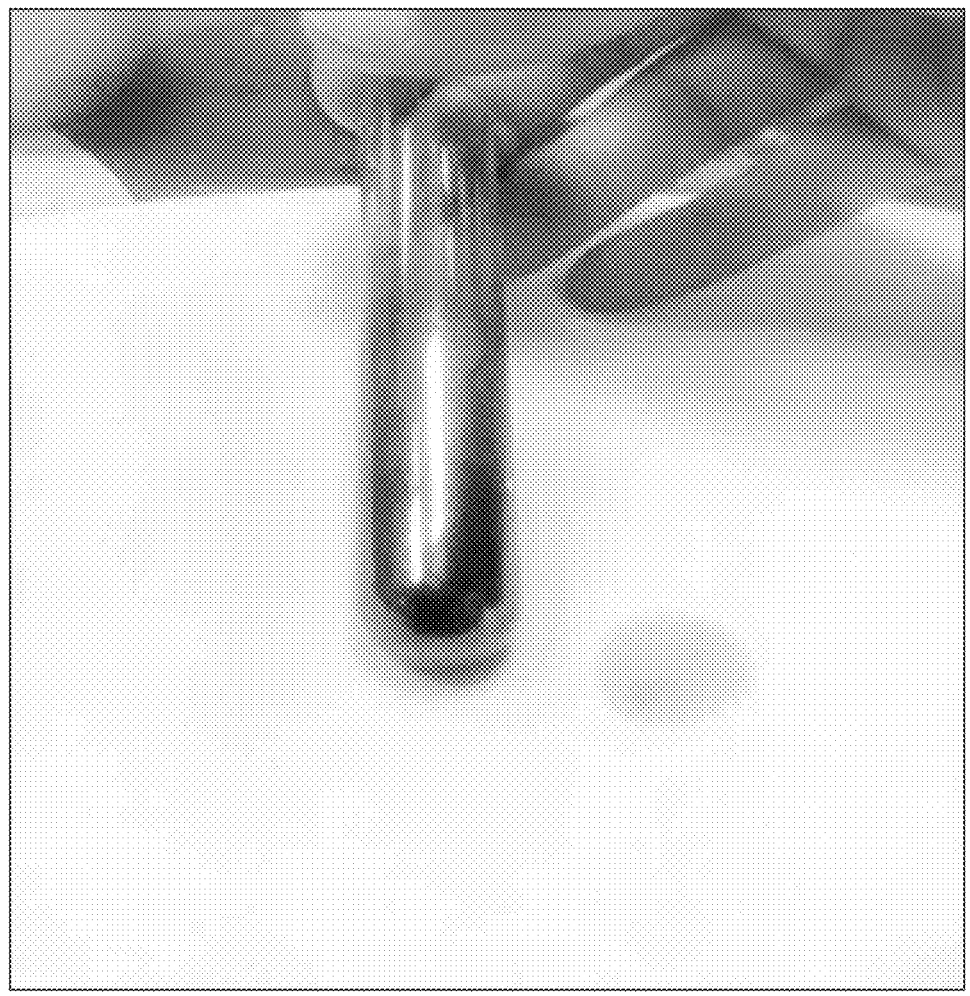
FIG. 8 shows a test tube coated with the silver nano-silver coating showing various color shades.

The glass object to be coated with silver nanoparticles was first degreased by an organic solvent (n-hexane), then washed with ethanol and distilled water. The glass object was then immersed in a 0.01 M $SnCl_2$ solution for few minutes, washed with distilled water and stored in a manner to provide protection from dust. A known volume of 0.1 M $AgNO_3$ stock solution (Example 2) was transferred to the glass substrate and then a ten-fold volume of 0.01 M curcumin stock solution was added to form a final solution. When the final solution was mixed and rotated to cover the desired surfaces, the silver mirror appeared within 20-25 minutes. When the glass object including the final solution was immersed in a water bath at a chosen temperature between 40° C. to 90° C., a silver mirror appeared within 5-10 min. The color shade of the mirror was temperature-dependent, and varied from silver to pink to gray to blue to green, as the temperature increased. For example, FIG. 6 shows the silver nanoparticles coated volumetric flasks displaying different shades of colors such as greenish and yellowish. FIG. 7 shows the beaker bottoms coated with silver nanoparticles showing varying shades of color. Finally, FIG. 8 is a test tube coated with silver nanoparticles illustrating the various shades of blue, pink and yellow color.

EXAMPLE 4

Nano-Silvering of Flat Glass Substrates

Two glass plates were placed facing each other in a glass beaker. Silver nitrate was then transferred from the stock solution (volume added is according to needed level), then curcumin solution was added (1 $AgNO_3$: 10 curcumin). The beaker was then immersed in a water bath at ≈50° C., whereupon a mirror appeared within 10 min Silvering one face of glass plates was carried out either by blowing hot air from beneath the plate or heating it on a hot plate at a chosen temperature.

EXAMPLE 5

Nano-Silvering of Glass Rods

Glass rods were immersed in the $AgNO_3$/curcumin solution (final solution) to the level required for silvering and kept immersed until the mirror appeared.

EXAMPLE 6

Determination of the Mass of Deposited Silver

The silver film (coating) on the glass container wall (formed as described in Example 3) was dissolved in dilute, hot, nitric acid (1:4), and the solution was received in a beaker. The glass surface of the plate was then washed with distilled water to remove all of the silver. One milliliter of fuming nitric acid was added and the solution was boiled for a few minutes and then cooled. Five drops of ferric alum (Ammonium iron (III) sulfate) solution were added as an indicator and the solution was titrated against 0.01 M potassium thiocyanate solution. The weight of silver deposited was found to be 75.6 mg, the estimated surface area was 600 $cm^2$, the weight of Ag deposited per $m^3$ was 1260 $mg/m^3$ and the efficiency of reduction reaction at 40 C.° was determined to be 70%. The unreacted (i.e., not reduced) silver could be recycled using literature methods. It is observed that excess reactants are required for the spraying process, which renders spraying economically unfeasible.

EXAMPLE 7

Spraying Process for Silvering Glass Plates with Different Color Shades

Two brown Pyrex glass sprayers were washed with distilled water. One was filled with 0.05 M, and preferably, 0.1 M curcumin solution. 0.05 M, preferably 0.1 M $AgNO_3$ solution was prepared as mentioned above and transferred to the second sprayer. The two solutions were equimolar. The outlets of the two sprayers were connected to one nozzle. The two sprayers were situated in a water thermostat. The glass plates were prepared as mentioned above. The thermostat was then adjusted to the chosen temperature, preferably between 40° C. and 95° C. Then air was blown through the sprayer inlets that are jointly connected to the air source.

EXAMPLE 8

Estimation of the Silver Film Thickness

The thickness of the silver film was estimated using the following formula;

$$H=(W\times10)/(S\times G) \qquad (1)$$

where H=thickness of the silver film in nun; w=weight of Ag in grams;

g=surface area of glass substrate in cm$^2$; s=density of silver (10.5 g/cm$^3$). Result: H=(75.6×10$^{-3}$×10)/(600×10.5)= 1.2×10$^{-4}$ mm=120 nm For comparison, an Elcometer 456, UK instrument was used to measure the thickness of the mirror layer. The thickness was found to be in the range of 150 to 200 nm. The gloss value of a flat glass surface mirror was measured using a KSJ gloss meter, Sheen Instrument, Japan. The gloss value found was equal to 196.0.

It is to be understood that the present invention is not limited to the embodiments described above, but encompasses any and all embodiments within the scope of the following claims.

We claim:

1. A method for coating a substrate with silver nanoparticles, consisting of:
   (a) providing a substrate, wherein the substrate is pre-washed with an organic solvent and stannous chloride (SnCl$_2$) solution prior to contacting the substrate with a coating;
   (b) combining an ammoniacal silver nitrate solution with a curcumin solution to form a final solution, wherein the ammoniacal silver nitrate solution consists of silver nitrate having a concentration of about 0.1M in 25% aqueous ammonia, further wherein the curcumin solution consists of an ethanol extract of the *Curcuma Longa* L.plant; and
   (c) contacting the final solution with the substrate to produce a nano-silver mirror-coating on the substrate, wherein the coating has a thickness of less than about 125 nm and further wherein the silver nanoparticles have an average particle size of about 4-6 nm.

2. The method for coating a substrate with silver nanoparticles according to claim 1, wherein the substrate is a container and the ammoniacal silver nitrate solution is combined with the curcumin solution in the container to form the final solution.

3. The method for coating a substrate with silver nanoparticles according to claim 2, wherein the container including the final solution is maintained at a temperature of 40° C. to about 90° C.

4. The method for coating a substrate with silver nanoparticles according to claim 1, wherein the substrate is glass.

5. The method for coating a substrate with silver nanoparticles according to claim 1, wherein the substrate includes at least one glass plate.

6. The method for coating a substrate with silver nanoparticles according to claim 1, wherein the substrate includes at least one glass rod.

7. The method for coating a substrate with silver nanoparticles according to claim 1, wherein the curcumin solution has a concentration of about 0.01M.

8. The method for coating a substrate with silver nanoparticles according to claim 1, wherein a ratio of the volume of the silver nitrate solution to the curcumin solution is about 1:10.

9. The method for coating a substrate with silver nanoparticles according to claim 1, wherein the silver nanoparticles are at least one of spherical, spheroidal, elongated spherical, triangular, cubic rod-shaped, and faceted.

10. The method for coating a substrate with silver nanoparticles according to claim 1, wherein the nano-silver coating on the substrate is electrically conductive.

11. The method for coating a substrate with silver nanoparticles according to claim 1, wherein the nano-silver coating on the substrate includes at least one of a blue color, a pink color, a yellow color, and a green color.

* * * * *